United States Patent [19]

Baba et al.

[11] Patent Number: 4,872,045
[45] Date of Patent: Oct. 3, 1989

[54] INPUT PROTECTION DEVICE FOR C-MOS DEVICE

[75] Inventors: Isao Baba, Yokohama; Takeo Kondo, Yokosuka; Leiichi Yanagisawa; Kenji Kohguchi, both of Kawasaki, all of Japan

[73] Assignee: Tokyo Shibaura Denki Kabushiki Kaisha, Kawasaki, Japan

[21] Appl. No.: 528,888

[22] Filed: Sep. 2, 1983

[30] Foreign Application Priority Data

Sep. 7, 1982 [JP] Japan ................................ 57-155503

[51] Int. Cl.⁴ ...................... H01L 29/80; H01L 29/78; H01L 27/02
[52] U.S. Cl. ......................................... 357/13; 357/42; 357/23.13
[58] Field of Search ...................... 357/42, 236 P, 13

[56] References Cited

U.S. PATENT DOCUMENTS 3,667,009 5/1972 Rugg .................................... 317/235

FOREIGN PATENT DOCUMENTS 1551956 11/1968 France .
2147940 3/1973 France .
55-143061(A) 7/1980 Japan .
56-83964 7/1981 Japan .

OTHER PUBLICATIONS

"C-MOS/SOS LSI Input/Output Protection Network", (8/1978)—B. T. Ahlport et al.
"Gate Protection of MIS Devices"—M. Lenzlinger—(Apr. 1971).

Primary Examiner—Rolf Hille
Assistant Examiner—Robert P. Limanek
Attorney, Agent, or Firm—Finnegan, Henderson, Farabow, Garrett, & Dunner

[57] ABSTRACT

An input protection device for a C-MOS device having an n-type semiconductor substrate and a p-type well region. The device comprises a diode consisting of the p-type well region and an n⁺-type layer diffusion formed in the p-type well region and connected between a gate of a C-MOS FET and ground. The n⁺-type layer of the diode has a higher impurity concentration and a greater diffusion depth than those of n⁺-type layers formed in the p-type well region and constitute the source and drain of an n-channel MOSFET.

9 Claims, 3 Drawing Sheets

INPUT PROTECTION DEVICE FOR C-MOS DEVICE

BACKGROUND OF THE INVENTION

This invention relates to an input protection device for a C-MOS device, particularly a C-MOS device based on a silicon gate process.

The C-MOS device usually has an input protection device, which is provided for the purpose of preventing rupture of an MOS FET due to application of a surge voltage to a gate thereof. FIG. 1 is a circuit diagram showing an input protection device. An external input terminal 10 is connected to an input terminal (i.e., gate) of a C-MOS device 14 through an input protection resistor 12. The input terminal of the C-MOS device 14 is also connected to a cathode of a diode 18 through a resistor 16. An anode of the diode 18 is grounded through a resistor 20. When a surge voltage is applied to the input terminal 10 of this structure, the diode 18 is reverse biased, so that the surge voltage is applied between the input terminal 10 and the ground terminal through the resistors 16 and 20 and diode 18 and not applied to the C-MOS device 14. The resistors 16 and 20 are ON resistances of the diode 18 when it is reverse biased.

FIG. 2 is a sectional view showing the structure of the conventional input protection device of the type noted. A p-type well region 24 is formed in the surface region of an n-type semiconductor substrate 22. An n+-type layer 26 is formed in the surface region of the p-type well region 24. The layer 26 serves as the cathode of the protection diode 18. Although not shown, p+-type layers which serve as the source and drain of a p-channel MOSFET is formed in the surface region of the semiconductor substrate 22, and n+-type layers serving as the source and drain of an n-channel MOSFET is formed in the surface region of the p-type well region 24. A field oxide film 28 is formed on the substrate surface, and an n+-type polysilicon layer 30 serving as the protection resistor 12 is formed on the field oxide film 28. A CVD oxide film 32 is formed on the polysilicon layer 30. The CVD oxide film 32 has contact holes formed near its opposite ends, and one end of aluminum leads 34 and 36 are connected to opposite end portions of the n+-type polysilicon layer 30 through the contact holes. The other end of the aluminum lead 34 is connected to the external input terminal 10. The other end of the aluminum lead 36 is connected to the n+-type layer 26 (i.e., the cathode of the diode 18).

The n+-type polysilicon layer 30 shown in FIG. 2 constitutes the input protection resistor 12 shown in FIG. 1. Its resistance is currently 1.0 to 1.5 kΩ. The contact resistance between the aluminum lead 36 and n+-layer 26 and the diffusion resistance of the n+-layer 26 in FIG. 2 constitute the resistor 16 shown in FIG. 1. Contact resistance between n+-type layer 26 and p-type well 24 and diffusion resistance of p-type well 24 in FIG. 2 constitute the resistor 20 shown in FIG. 1. The gate voltage $V_G$ applied to the input terminal of the CMOS device 14 is given as $$V_G = V \times \frac{Rb + Rc}{Ra + Rb + Rc} \quad (1)$$

where Ra, Rb and Rc represent the resistances of the resistors 12, 16 and 20 respectively and V represents the surge voltage (positive voltage).

It will be seen from the equation (1) that if the resistance Ra of the input protection resistor 12 is much higher than the ON resistances Rb and Rc of the protection diode 18 when the diode is reverse biased, the gate voltage $V_G$ is much lower compared to the surge voltage V. With the structure of FIG. 2, however, the n-type impurity concentration of the n+-type layer 26 constituting the cathode of the diode fluctuates greatly. In addition, the contact resistance between the aluminum lead 36 and n+-type layer 26 is high, so that the ON resistance Rb + Rc of the diode 18 when it is reverse biased (particularly resistance Rb) is high (usually 490Ω) and fluctuates greatly.

Meanwhile, there is a trend toward thinner gate oxide films of the C-MOS device together with increasing integration density. This means more stringent demands for the performance of the input protection device. It is desired that the protective breakdown voltage be higher and subject to fewer fluctuations. It may be thought from the equation (1) that the protective breakdown voltage can be increased by increasing the resistance of the input protection resistor. Doing so, however, reduces the operating speed and is undesirable.

SUMMARY OF THE INVENTION

The object of the present invention is to provide an input protection device for protecting a CMOS device against even a high surge voltage by lowering the ON resistance of an input protection diode without raising protection resistance and without lowering the operation speed of the CMOS device even if the ON resistance inherent in the diode differs from the desired value.

The above object of the invention is attained by an input protection device for a C-MOS device, which comprises an n-type semiconductor substrate, a p-type well region formed in the surface region of the substrate, first n-type layers formed in the surface region of the p-type well region, serving as a source and drain of an n-channel MOSFET, a second n-type layer formed in the surface region of the p-type well region, serving as a cathode of a diode, the impurity concentration of the second n-type layer being higher than the impurity concentrtion of the first n-type layers, and an n+-type polysilicon layer formed on the semiconductor substrate through an insulating film and having one end connected to the second n-type layer.

DETAILED DESCRIPTION OF THE PREFERRED EMBODIMENT

Figure 1:
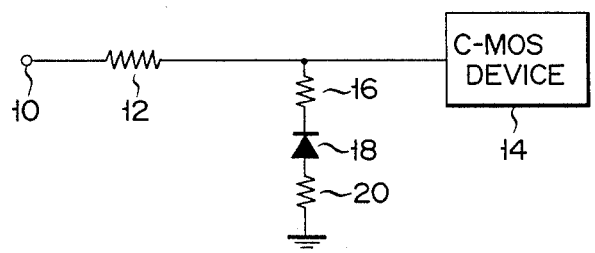
FIG. 1 is a circuit diagram showing an input protection device for a C-MOS device.
Figure 2:
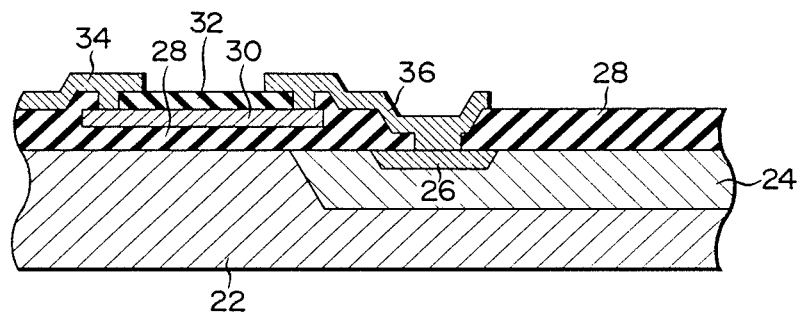
FIG. 2 is a sectional view showing the prior art structure of the input protection device.
Figure 4:
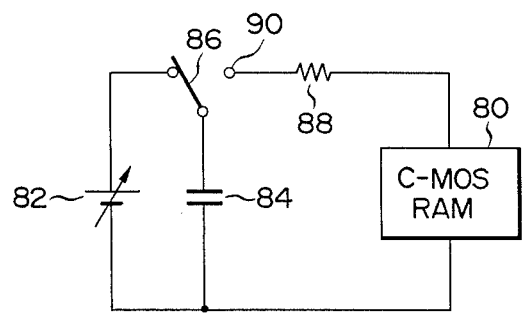
FIG. 4 is a circuit diagram showing a testing circuit for evaluating the embodiment of the invention.
Figure 3A:
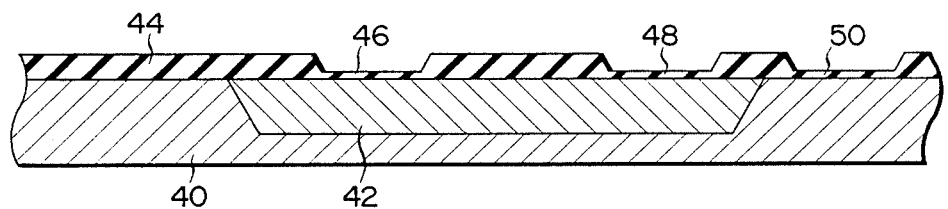
FIGS. 3A through 3H are sectional views illustrating the steps of manufacture of one embodiment of the input protection device according to the invention.
Figure 3B:
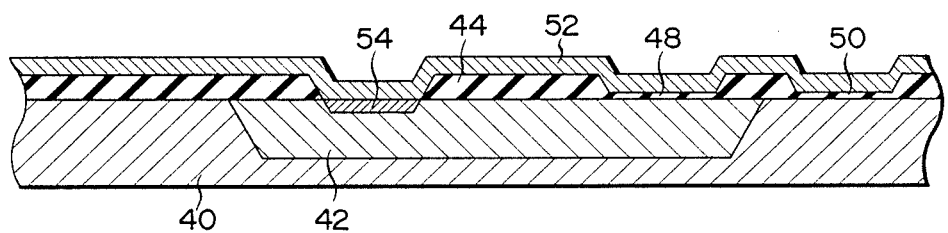
Figure 3C:
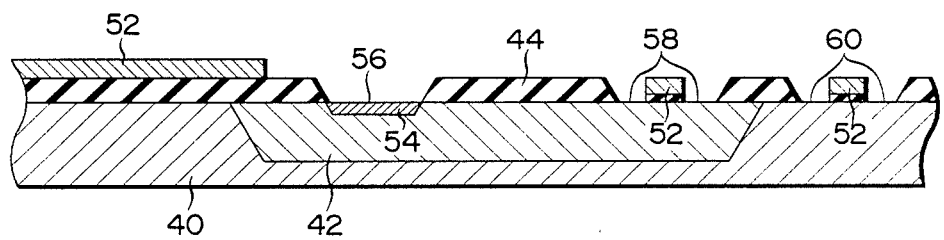
Figure 3D:
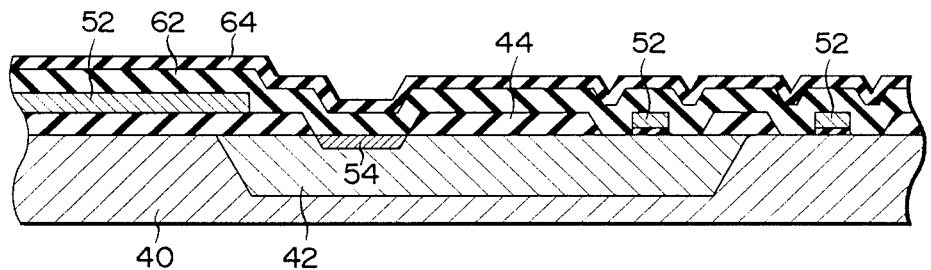
Figure 3E:
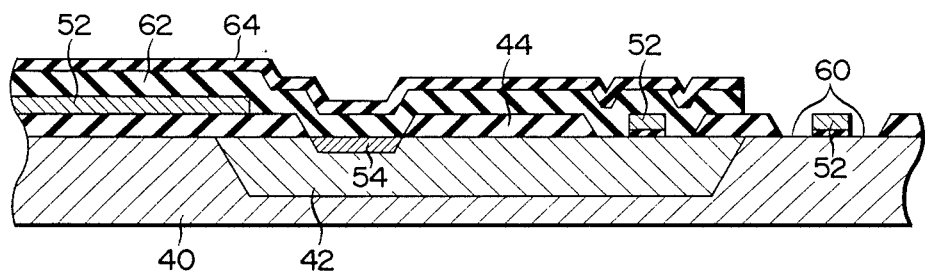
Figure 3F:
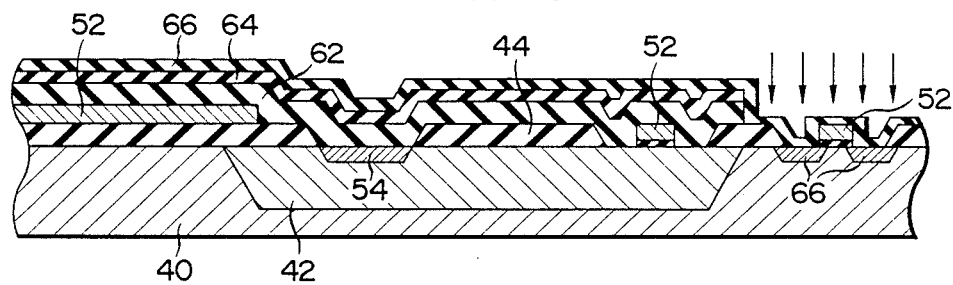
Figure 3G:
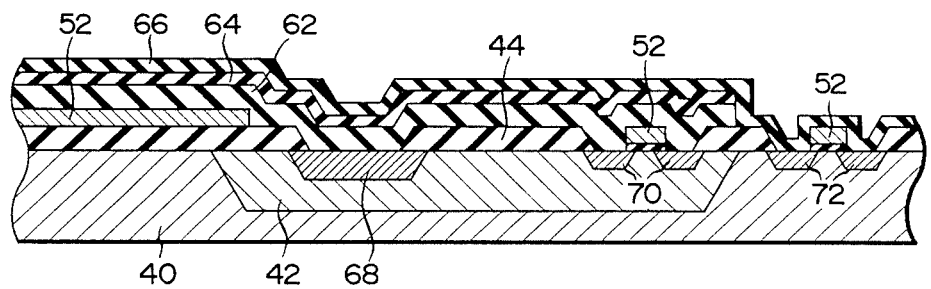
Figure 3H:
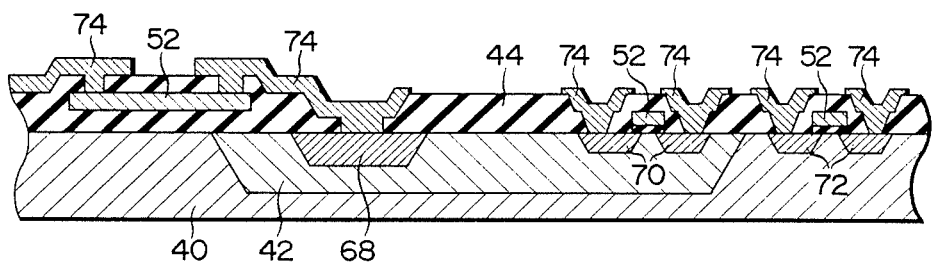

Now, an embodiment of the input protection device for a C-MOS device according to the invention will be described with reference to FIGS. 3A through 3H. The circuit diagram of this embodiment is the same as shown in FIG. 1. As shown in FIG. 3A, gate oxide films 46, 48 and 50 having predetermined patterns are formed in a field oxide film 44 on an n-type semiconductor substrate 40 having a p-type well region 42 in the surface region. The gate oxide films 46 and 48 are formed on the p-type well region 42, while the gate oxide film 50 is formed on the substrate 40. The gate oxide film 46 is formed in a predetermined area, in which a protection diode is to be formed. The gate oxide films 48 and 50 are formed in predetermined areas, in which an n-channel and p-channel MOSFETs are to be formed, respectively. In the prior art, a polysilicon layer is formed to cover the entire surface of the oxide film 44. According to the invention, as shown in FIG. 3B, the gate oxide film 46 for the protection diode is removed by photoetching, and then a polysilicon layer 52 is formed to cover the entire wafer surface. Subsequently, the wafer is heated to 1,000° C. in a gas atmosphere composed of phosphorus oxychloride (POCl$_3$), oxygen (O$_2$) and nitrogen (N$_2$), thereby diffusing phosphorus in the polysilicon layer 52 to form an n$^+$-type polysilicon layer and also diffusing phosphorus in the protection diode formation area of the p-type well region 42 to form an n-type layer 54. Then, as shown in FIG. 3C, the n$^+$-type polysilicon layer 52 is selectively photoetched to leave predetermined portions corresponding to a protection resistor and gate electrode of MOSFETs. In this step, openings 56, 58 and 60 are formed. The opening 56 is formed in the protection diode formation area, and the openings 58 and 60 are formed in n- and p-channel MOSFET formation areas, respectively. Then, as shown in FIG. 3D, a phosphorus silicate glass (PSG) film 62 and SiO$_2$ film 64 are successively formed on the wafer by the CVD process. Then, as shown in FIG. 3E, the PSG film 62 and SiO$_2$ film 64 over the p-channel MOSFET formation area are removed by photoetching to form the opening 60 again. Then, as shown in FIG. 3F, an SiO$_2$ film 66 is formed by the CVD process to cover the entire wafer surface. Then boron is ion implanted. More specifically, the boron is ion implanted onto the substrate 40 through the opening formed by the removal of the PSG film 62, i.e., the opening 60 in FIG. 3E, to form a p-type layer 66 serving as the source and drain of the p-channel MOSFET. Subsequently, the wafer is heated to 1,000° C. in a dry nitrogen atmosphere, thereby effecting diffusion of p- and n-type impurities from respective diffusion sources constituted by the p-type layers 66 with boron ion implanted therein and the PSG film 62. Then, as shown in FIG. 3G, an n-type layer 68 serving as the cathode of diode, n-type layers 70 serving as the source and drain of n-channel MOSFET and p-type layers 72 serving as the source and drain of the p-channel MOSFET are simultaneously diffusion formed. Then, as shown in FIG. 3H, unnecesary portions of the SiO$_2$ films 64 and 66 and the PSG film 62 are removed by photoetching. Contact holes are then formed, and aluminum leads 74 are connected to the wafer through the contact holes, thus completing the input protection device of FIG. 1. Although not shown, the polysilicon 52 constituting the input protection resistor and the polysilicon 52 constituting the gates of MOSFETs are connected to one another.

In the prior art, the n$^+$-type layer 68 serving as the cathode of the diode is not preliminarily doped with phosphorus by diffusion but simultaneously formed by diffusion together with the n$^+$-type layers 70 serving as the source and drain of the n-channel MOSFET. Therefore, the depth of diffusion and impurity concentration of the layer 68 are equal to those of the layer 70. In this embodiment, phosphorus is preliminarily diffused (see FIG. 3B), so that the n$^+$-type layer 68 serving as the cathode of diode has a greater diffusion depth and a higher impurity concentration than those of the n$^+$-type layers 70 serving as the source and drain of the n-channel MOSFET. Further, since diffusion is performed twice to obtain the n$^+$-type layer 68, the fluctuations of the impurity concentration are reduced. The contact resistance between the aluminum lead 74 and n$^+$-type layer 68 and the diffusion resistance of the n$^+$-type layer 68 as well as the fluctuations of these resistances thus can be reduced. That is, the resistance Rb of the resistor 16 in FIG. 1 can be reduced to make the resistance value Rb +Rc to be 250 to 300 Ω.

Usually, in the input protection circuit for protection against surges, the ratio of the resistance of the ON resistance of the diode to the input protection resistor should be less than 1 : 4. This requirement can be sufficiently met by the embodiment, in which the resistance Rb +Rc of the ON resistance of the diode is 250 to 300 Ω, even if the input protection resistor has the same resistance, i.e., 1.0 to 1.5 kΩ, as in the prior art.

As has been shown, with the above embodiment the n$^+$-type layer serving as the cathode of the protection diode has a high impurity concentration subject to fewer fluctuations and a large diffusion depth, so that it is possible to reduce the resistance of the ON resistance of the diode so as to make the protective breakdown voltage of the input protection circuit high and constant.

The results of an experiment conducted to verify the effects of the embodiment of the invention will now be described. A surge voltage is applied to a C-MOS RAM 80 having an input protection circuit, in which the input protection resistance is set to 1.4 kΩ and the ON resistance of the diode is set to 300 Ω. The thickness of the gate oxide film of the C-MOS RAM 80 is set to 800 Å. A voltage across a capacitor (200 pF) 84 charged from a testing power source 82 is applied to the C-MOS RAM 80 through a switch 86 and an evaluation resistor (2 kΩ) 88. In this case, a surge voltage of approximately 900 V appeared from the terminal 90 of switch 86. Sufficient protection against the surge can be obtained if the ratio of the ON resistance of the diode and the resistance of the evaluation resistor plus the resistance of the input protection resistor is smaller than 1 : 12. Actually, the C-MOS RAM 80 is not ruptured when the surge voltage is below 925 V. Even when the surge voltage is 925 V, the MOSFET gate oxide film is not ruptured, but a rupture of a different part is confirmed.

As has been described in the foregoing, according to the invention it is possible to obtain an input protection device for a C-MOS device, with which the protective breakdown voltage can be increased without reducing the operational speed. The C-MOS device thus can be protected against rupture due to a surge, which means a contribution to the improvement of the reliability of the C-MOS.

The process of manufacture described above is by no means limitative, and any other process may be used so long as it include a diode cathode n$^+$-layer having a higher impurity concentration and a greater diffusion depth than those of the n$^+$-type layers which serve as the source and drain of the n-channel MOSFET.

What is claimed is:

1. An input protection device for a C-MOS device comprising:

an n-type semiconductor substrate;

a p-type well region formed in a surface region of said n-type semiconductor substrate;

first n-type layers formed in a surface region of said p-type well region, serving as a source and drain of an n-channel MOSFET;

a second n-type layer formed in the surface region of said p-type well region, serving as a cathode of a diode having a single PN junction, the impurity concentration of said second n-type layer being higher than the impurity concentration of said first n-type layer;

p-type layers formed in the surface region of said n-type substrate, serving as a source and drain of a p-channel MOSFET;

a first n+-type polysilicon layer formed on said n-type semiconductor substrate; and a first insulating film isolating said first n+-type polysilicon layer from said substrate;

said first n+-type polysilicon layer having one end connected to said second n-type layer and serving as a protection resistor.

2. An input protection device according to claim 1, wherein said second n-type layer has a greater diffussion depth than the diffusion depth of said first n-type layers.

3. An input protection device according to claim 1, wherein said second n-type layer is formed through two diffusion steps.

4. An input protection device according to claim 1, wherein the resistance of said n+-type polysilicon layer is not higher than 1.5 kΩ.

5. An input protection device according to claim 1, wherein the ON resistance of a diode which is reverse biased and is constituted by said p-type well region and second n-type layer is not higher than one-fourth of the resistance of said n+-type polysilicon layer.

6. An input protection device according to claim 1, wherein a thickness of a gate oxide film of said n-channel MOSFET is 800 Å.

7. An input protection device according to claim 1, further comprising:

a second insulating film formed on said n-type semiconductor substrate and on said p-type well region;

second n+-type polysilicon layers formed on said second insulating film on said n-type semiconductor substrate and said p-type well region, said second n+-type polysilicon layers serving as gate electrodes of said p-channel MOSFET and said n-channel MOSFET, each of said second n+-type polysilicon layers having a first end connected to said first n+-type polysilicon layer.

8. An input protection device according to claim 1, wherein a ratio of ON resistance of said diode to a resistane of said first n+-type polysilicon layer is not greater than 1 : 4.

9. An input protection device according to claim 1, wherein said p-type well region is connected to a ground terminal and wherein said first n+-type polysilicon layer comprises a second end adapted to receive an input signal to the C-MOS device.

* * * * *